United States Patent [19]

Di Vita et al.

[11] Patent Number: 4,703,488
[45] Date of Patent: Oct. 27, 1987

[54] SEMICONDUCTOR LASERS

[75] Inventors: Pietro Di Vita, Turin; Marcello Potenza, Genoa, both of Italy

[73] Assignee: Cselt - Centro Studi e Laboratori Telecomunicazioni S.p.A., Torino, Italy

[21] Appl. No.: 779,788

[22] Filed: Sep. 24, 1985

[30] Foreign Application Priority Data

Nov. 13, 1984 [IT] Italy ............................ 68133 A/84

[51] Int. Cl.⁴ .............................................. H01S 3/19
[52] U.S. Cl. .................................................... 372/44
[58] Field of Search ...................... 372/43, 44; 357/16, 357/17, 61

[56] References Cited

U.S. PATENT DOCUMENTS 3,986,194  10/1976  Masumoto et al. ................ 372/44

Primary Examiner—Gene Wan
Attorney, Agent, or Firm—Karl F. Ross; Herbert Dubno

[57] ABSTRACT

These improvements to semiconductor lasers allow the fabrication of high-efficiency photoemitting devices thanks to a decrease in the threshold current necessary to optical emission stimulation. They consist in the application of a suitable magnetic field apt to confine carrier current within a limited zone of the active layer.

5 Claims, 2 Drawing Figures

SEMICONDUCTOR LASERS

FIELD OF THE INVENTION

The present invention relates to semiconductor devices usable in the telecommunications domain and, more particularly, to semiconductor lasers.

BACKGROUND OF THE INVENTION

Recently, semiconductor lasers have become of increasing importance because of their possible use as a signal source in optical-fiber telecommunications systems.

These devices consist of a crystal composed of layers of semiconductor material having different characteristics of doping and electrical conductivity. Such a structure, which electrically performs as a p-n junction, from the optical standpoint supplies a waveguide for an optical field which is generated inside the device by the laser effect. This phenomenon takes place thanks to a convenient choice of the characteristics of the above-cited semiconductor layers and by a direct device biasing.

Under these conditions a stimulated recombination is obtained of electrons and holes injected into the crystal near the main device junction. In this way the optical field generated in the laser resonator by spontaneous emission, interacting with charge carriers, is amplified while propagating in the crystal waveguide and is partly transmitted to the exterior through the end faces of the crystal.

Originally, laser devices were, from the electrical standpoint, simple p-n junctions between semiconductors having equal gaps of forbidden energy (i.e. so called homojunction lasers). These devices had a limited electrical confinement of charge carriers, which diffused into a wide semiconductor zone, and a limited optical confinement in the regions where the laser effect took place.

Consequently, a high threshold current was necessary to reach the laser effect, which could be obtained only at very low temperatures ($-200°$ C.) and in pulsed operation. Moreover, the devices suffered high optical absorption losses.

The device performances were improved by using so-called heterojunctions, i.e. junctions between semiconductors materials having different forbidden energy gaps. These efficiently confine electrons and holes (thanks to high internal barriers of potential inside the crystal band structure), as well as the optical field in the central laser zone, in correspondence with the active layer (thanks to the refractive index profile which is generated in such a structure). Thus electron-photon interaction efficiency is increased, while current threshold is considerably decreased, allowing continuous operation of the laser at room temperature.

Nevertheless, these structures still have disadvantages due to the spatial instability of the laser emission, resulting from the presence of filaments in the active layer. In fact, under these conditions the carrier distribution is easily altered by any irregularity present in the crystal, generating an uneven optical gain profile and still worse, a time varying gain profile. Hence the impossibility of efficiently exploiting the laser emission of such structures.

A further evolution consists of supplying the structure with an additional confinement in the junction plane by the use of strip geometry.

This has been originally obtained by shrinking carrier injection to a strip contact of nearly 10 $\mu$m, defined by the deposition of insulating layers on its sides or by laterally damaging the lattice by bombardment with carriers or heavier ions. Which reduces, but does not completely eliminate, conductive and diffusive phenomena affecting carriers in regions near the active layer. The techniques of bombardment in depth (until the active layer is obtained) could further improve the situation, but is difficult to implement.

More efficient confinement methods are obtained by lateral variations by composition (buried heterostructures), in doping (transverse junction structures) and as a result of the thickness of a pair of adjacent layers (rib geometry).

However, from a technological standpoint these methods are difficult to implement. For example, LPE growth (liquid phase epitaxy) is carried out in two steps, with consequent lengthening of fabrication times and increase in the risk of damaging the already grown structure. Other disadvantages concern the growth on non-planar substrates, and generally on surfaces having a different crystalline orientation.

SUMMARY OF THE INVENTION

These disadvantages are overcome by the improvements to semiconductor lasers, provided by the present invention, which, even though they are applicable to any already examined structure, present maximum advantages when used in simpler strip lasers, the strip of which is delimited by deposition of insulating layers or by bombardment. These lasers, even though they remain easy to fabricate, have highly improved characteristics, e.g. their threshold current is lowered.

The present invention provides improvements to semiconductor lasers comprising a plurality of differently doped layers traversed by electric charge carriers, capable of stimulating in an active layer the emission of coherent light radiation, characterized in that the charge carriers are confined in the central region of the active layer by applying a magnetic field parallel to the light radiation and with opposite directions in two half spaces defined by a plane parallel to the optical radiation, perpendicular to the active layer and traversing the median part of said active layer.

BRIEF DESCRIPTION OF THE DRAWING

Further preferred features of the invention will appear from the following description of a preferred embodiment thereof, given by way of example and not in a limiting sense, illustrated with reference to the accompanying drawings in which.

SPECIFIC DESCRIPTION

The confinement of charge carriers within a central region of the active layer is obtained, according to the invention, by applying a suitable magnetic field, capable of deflecting the electrical charges moving in the semiconductor.

Figure 1:
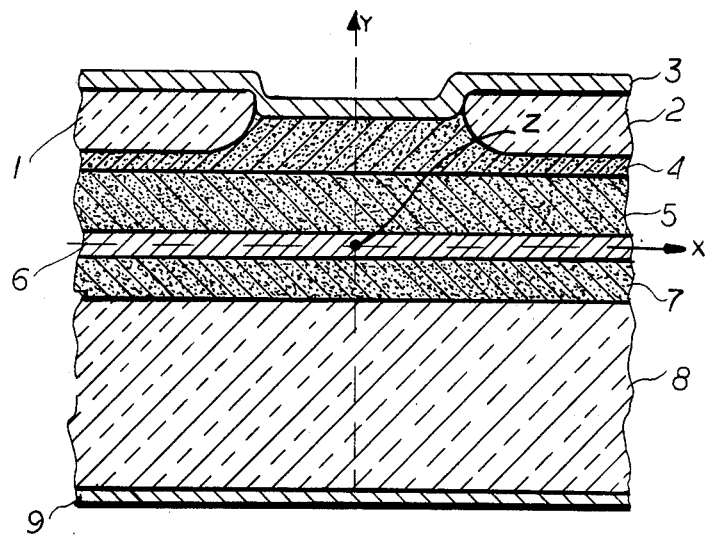
FIG. 1 is a cross sectional view of the structure of a semiconductor laser.

For example, let us consider this application in the case of a laser with strip geometry delimited by insulating layers, denoted by 1 and 2 in FIG. 1. Whereupon a metallization 3 is deposited, brought into contact with a first layer 4 of semiconductor material, which is highly doped to improve the electrical conductivity. The following layers are:

a cladding layer with conductivity P, denoted by 5;
the active layer 6, unintentionally doped;
a cladding layer N, denoted by 7;
the substrate 8, provided with a metallic layer 9 for the device electrical connection.

An orthogonal reference system is also represented, wherein axis x is parallel to the layers and passes through the active layer 6, axis y passes through the median part of the contact strip, i.e. in the midde of the space between layers 1 and 2, and axis z is outgoing from the drawing plane, parallel to the light radiation.

The magnetic field is applied longitudinally to the device (parallel to axis z) and has opposite directions in the half planes of positive and negative x from the origin of the orthogonal reference system. In this way the action exerted by the field on the injection current, consisting of electrons moving from layer 9 to layer 3, tends to hamper phenomena of conduction and lateral diffusion affecting the charges injected into volume P of the device (layers 4, 5 and 6).

To achieve that, taking into account the motion direction and the electric charge sign, the magnetic field must have a direction going into the sheet in half plane $x<0$ and outgoing in the half plane $x>0$. The best efficiency is achieved when the desired configuration of magnetic field is applied at least in volume P of the device.

The magnetic flux density necessary to obtain the desired confinement can be estimated to be about 1T.

This estimate can be approximately derived from the expression:

$$B = \frac{P_{sn} e S}{(1-S)} \cdot \frac{I_s}{I}$$

where
B is the flux density;
$\rho_s$ is the average resistivity due to spreading, (i.e. to conductivity and lateral diffusion effects suffered by carriers);
n is the density of carriers injected into the device;
e is the value of the electronic charge;
S is the strip width;
1 is the total width of the device;
$I_s$ is the current subject to spreading and lateral diffusion;
I is the current confined in the injection stripe.

The flux density of 1T can be obtained e.g. by permanently magnetized materials drawn into threads or small plates with typical thickness ranging from 10 to 100 μm. In this way they can be positioned with sufficient accuracy with respect to the device.

Values of flux density in the range of the above-mentioned value do not greatly affect the crystal band structure at room temperature, but they may affect diffusive carrier properties. Which entails an increased electrical confinement also in y direction (perpendicular to the layers), and hence a reduced threshold current, which, in case of structures characterized by small gap variations ($\approx 0.10$ eV) on wide area devices can reach about $\approx 40\%$ at the mentioned magnetic flux density.

Figure 2:
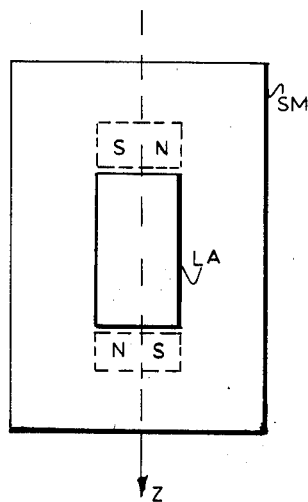
FIG. 2 is a diagram showing a practical embodiment of the improvements to the invention.

A possible embodiment, represented in FIG. 2, can consist of a laser device LA soldered to a heat sink SM of magnetic material, magnetized such as to generate the previously described field configuration. N and S denote polar expansions made in the heat sink.

We claim:

1. A semiconductor laser, comprising:
a substrate;
a plurality of differently doped semiconductor layers on said substrate together defining an active layer which receives light radiation in a direction which is parallel to said active layer for light amplification by laser action in said active layer;
means for injecting charge carriers into said active layer; and
means for confining said charge carriers to a central zone of said active layer by applying a magnetic field parallel to said direction of light radiation and with opposite directions in two half regions of said active layer separated by a plane parallel to said direction of light radiation, perpendicular to said semiconductor layers and traversing said active layer medianly.

2. The semiconductor laser defined in claim 1 which is a heterojunction electronic device of strip geometry delimited by a pair of insulating layers.

3. The semiconductor laser defined in claim 1 wherein said means for confining said charge carriers includes a permanent magnet heat sink soldered to a body formed with said active layer and said substrate.

4. The semiconductor laser defined in claim 1 wherein said means for confining said charge carriers includes small magnetic plates disposed near a body formed with said active layer and said substrate and accurately positioned with respect to said body.

5. The semiconductor laser defined in claim 1 wherein said means for confining said charge carriers includes small magnetized wires disposed near a body formed with said active layer and said substrate and accurately positioned with respect to said body.

* * * * *